(12) United States Patent
Waller et al.

(10) Patent No.: US 10,726,184 B1
(45) Date of Patent: *Jul. 28, 2020

(54) METHOD FOR OPTIMIZING PLACE-AND-ROUTING USING A RANDOM NORMALIZED POLISH EXPRESSION

(71) Applicant: Pulsic Limited, Bristol (GB)

(72) Inventors: Mark Waller, Gloucestershire (GB); Paul Clewes, Northumberland (GB); Liang Gao, Gateshead (GB); Jonathan Longrigg, Newcastle upon Tyne (GB)

(73) Assignee: Pulsic Limited, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/950,112

(22) Filed: Apr. 10, 2018

Related U.S. Application Data

(63) Continuation of application No. 13/270,085, filed on Oct. 10, 2011, now Pat. No. 9,940,421.

(60) Provisional application No. 61/392,021, filed on Oct. 11, 2010.

(51) Int. Cl.
| | |
|---|---|
| *G06F 17/50* | (2006.01) |
| *G06F 30/392* | (2020.01) |
| *G06F 30/39* | (2020.01) |
| *G06F 30/394* | (2020.01) |
| *G09G 3/20* | (2006.01) |

(52) U.S. Cl.
CPC ............ *G06F 30/392* (2020.01); *G06F 30/39* (2020.01); *G06F 30/394* (2020.01); *G09G 3/2088* (2013.01)

(58) Field of Classification Search
CPC ............ G06F 17/5072; G06F 17/5068; G06F 17/5077; G09G 3/2088
USPC ................ 716/118–119, 122, 126, 129–130, 716/132–135, 139
See application file for complete search history.

(56) References Cited

U.S. PATENT DOCUMENTS

| | | |
|---|---|---|
| 4,615,011 A | 9/1986 | Linsker |
| 5,308,798 A | 5/1994 | Brasen et al. |
| 6,574,783 B1 | 6/2003 | Zhuang et al. |
| 6,766,502 B1 * | 7/2004 | Pyo ....................... G06F 30/394 716/129 |
| 7,131,096 B1 * | 10/2006 | Balsdon ............. G06F 17/5077 716/129 |
| 7,823,116 B2 | 10/2010 | Chan |
| 8,751,999 B2 | 6/2014 | Shibuya |
| 2005/0081173 A1 | 4/2005 | Peyran |

OTHER PUBLICATIONS

Sait et al., Chapter 3: Floorplaning, Sep. 2003, Lecutre of King Fehd University of Petroleum & Mineral, pp. 1-8.

(Continued)

*Primary Examiner* — Nghia M Doan
(74) *Attorney, Agent, or Firm* — Aka Chan LLP

(57) ABSTRACT

Simultaneous automatic placement and routing speeds up implementation an integrated circuit layout and improves the resulting layout such that the layout is more compact, has reduced parasitics, and has improved circuit performance characteristics (e.g., power, frequency, propagation delay, gain, and stability). A technique generates solutions based on random normalized polish expression, and includes cost considerations based on routing of interconnect.

20 Claims, 7 Drawing Sheets

(56) References Cited

OTHER PUBLICATIONS

Chen et al., Non-slicing Floorplans with Boundary Constraints using Generalized Polish Expression, 2003, IEEE, pp. 342-345.
EECS Northwestern University, Floorplanning, Oct. 9, 2002, Northwestern University, pp. 1-27.

* cited by examiner

12H34HV56V7HV

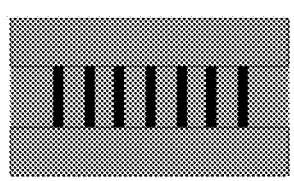
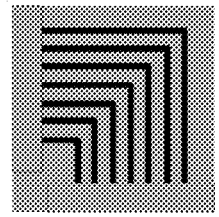
Figure 7A    Figure 7B    Figure 7C
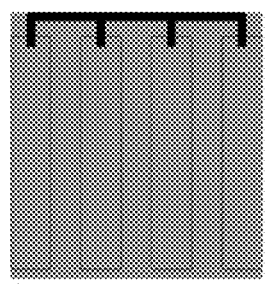
Figure 8A    Figure 8B
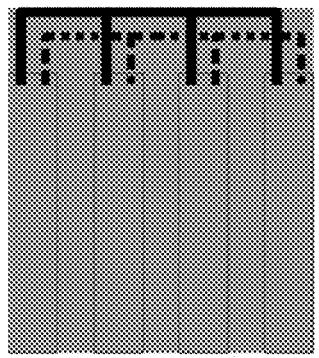
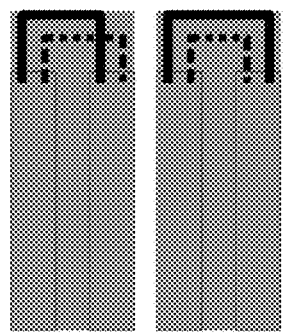
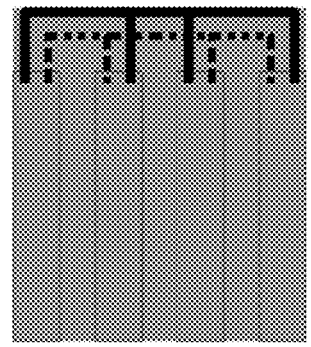
Figure 9A    Figure 9B    Figure 9C    Figure 9D

METHOD FOR OPTIMIZING PLACE-AND-ROUTING USING A RANDOM NORMALIZED POLISH EXPRESSION

CROSS-REFERENCE TO RELATED APPLICATIONS

This patent application is a continuation of U.S. patent application Ser. No. 13/270,085, filed Oct. 10, 2011, issued as U.S. Pat. No. 9,940,421 on Apr. 10, 2018, which claims priority to U.S. patent application 61/392,021, filed Oct. 11, 2010. These applications are incorporated by reference along with all other references cited in this application.

BACKGROUND OF THE INVENTION

The present invention relates to the field of electronic design automation for integrated circuits, and in particular, to simultaneous place and route for analog design.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, voltage converters, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications or development. Higher speed internet web servers will lead to greater on-line commerce including on-line stock trading, book sales, auctions, and grocery shopping, just to name a few examples. Higher performance integrated circuits will improve the performance of the products in which they are incorporated.

Large modern day integrated circuits have millions of devices including gates and transistors and are very complex. As process technology improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire to for higher integration and better performance in integrated circuits.

An integrated circuit may be specified using a netlist and a layout. The netlist provides information about devices or components of the integrated circuit and their connectivity. The integrated circuit layout or integrated circuit mask layout is the representation of an integrated circuit in terms of planar geometric shapes, patterns, and features that correspond to shapes used in a mask to fabricate the circuit. A design engineer or mask designer may create the layout the integrated circuit. Some features in the layout or certain masks may be automatically generated, such as automatic placement of elements and automatic routing of these elements.

Therefore, there is a need for improved placing and routing circuitry, especially for analog circuits.

BRIEF SUMMARY OF THE INVENTION

Simultaneous automatic placement and routing speeds up implementation an integrated circuit layout and improves the resulting layout such that the layout is more compact, reduced parasitics, and improved circuit performance characteristics (e.g., power, frequency, propagation delay, gain, and stability).

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 7A-7C show an example of a simultaneous place and route.

FIGS. 8A-8B show an example of a simultaneous place and route.

FIGS. 9A-9D show an example of a simultaneous place and route.

DETAILED DESCRIPTION OF THE INVENTION

Figure 1:
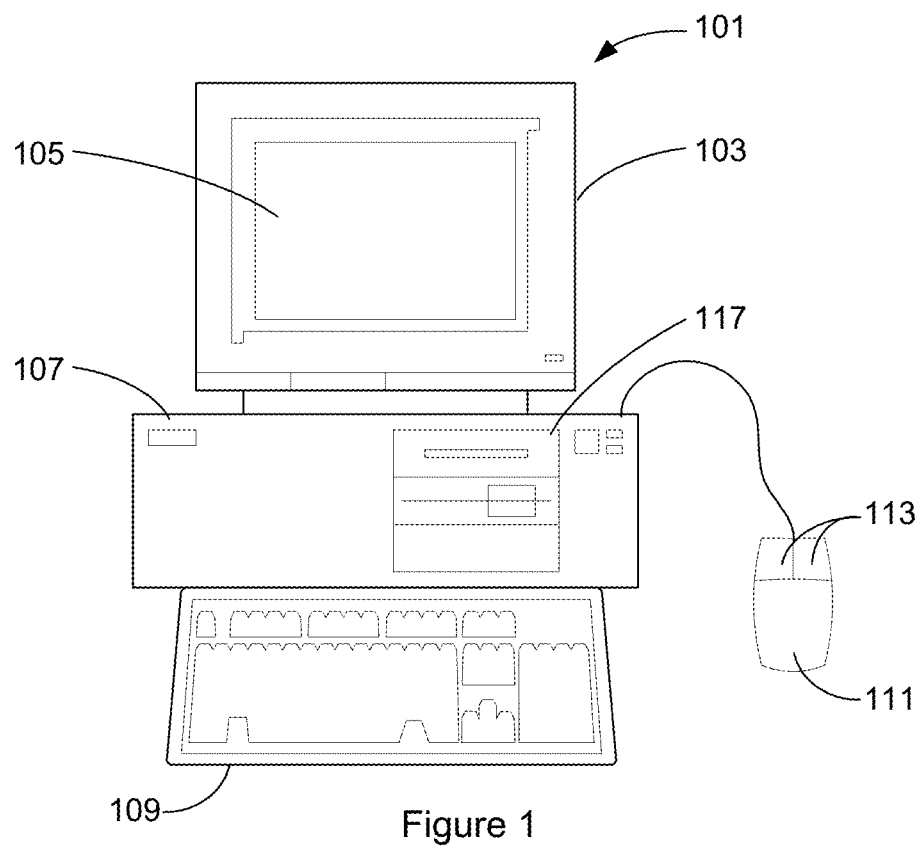
FIG. 1 shows a system of the present invention for performing electronic circuit design, including automatic simultaneous placement and routing.

FIG. 1 shows an electronic design automation (EDA) system of the present invention for designing an electronic circuit or integrated circuit, including automatic simultaneous placement and routing. In an embodiment, the invention is software that executes on a computer workstation system, such as shown in FIG. 1. FIG. 1 shows a computer system 101 that includes a monitor 103, screen 105, enclosure 107, keyboard 109, and mouse 111. Mouse 111 may have one or more buttons such as mouse buttons 113. Enclosure 107 (may also be referred to as a system unit, cabinet, or case) houses familiar computer components, some of which are not shown, such as a processor, memory, mass storage devices 117, and the like.

Mass storage devices 117 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

A computer-implemented or computer-executable version or computer program product of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on mass storage device 117. The source code of the software of the present invention may also be stored or reside on mass storage device 117 (e.g., hard disk, magnetic disk, tape, or CD-ROM). As a further example, code of the invention may be transmitted via wires, radio waves, or through a network such as the Internet.

Figure 2:
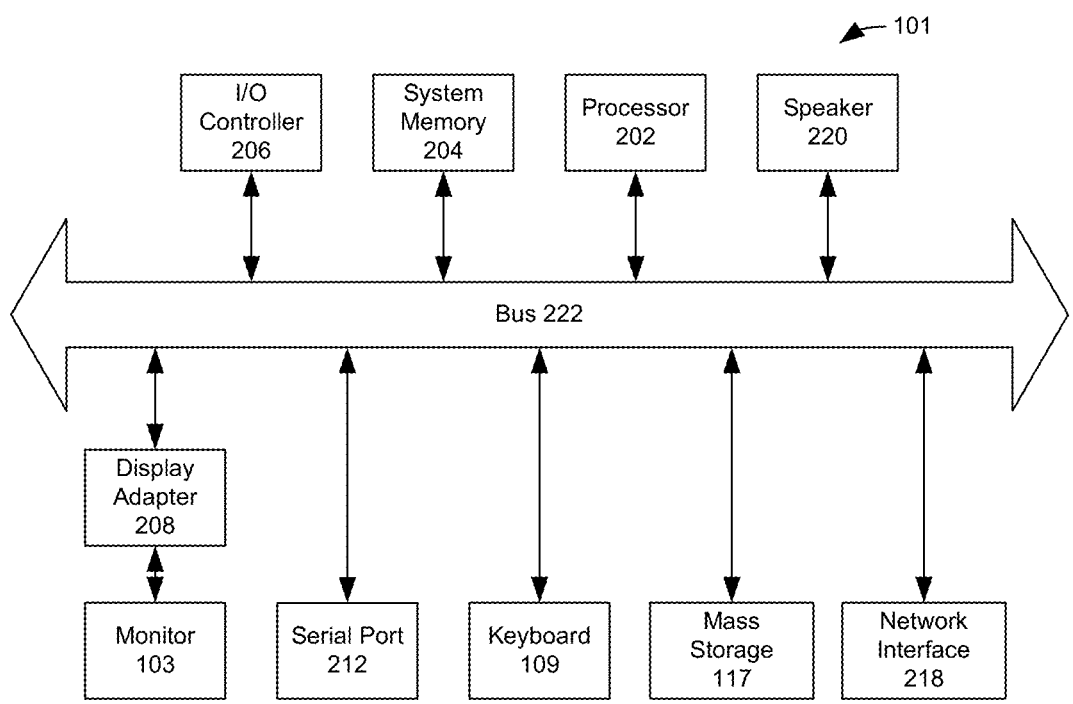
FIG. 2 shows a simplified system block diagram of computer system used in implementation of the present invention.

FIG. 2 shows a system block diagram of computer system 101 used to execute software of the present invention. As in FIG. 1, computer system 101 includes monitor 103, keyboard 109, and mass storage devices 117. Computer system 101 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

The processor may be a dual core or multicore processor, where there are multiple processor cores on a single integrated circuit. The system may also be part of a distributed computing environment. In a distributed computing environment, individual computing systems are connected to a network and are available to lend computing resources to another system in the network as needed. The network may be an internal Ethernet network, Internet, or other network.

Arrows such as 222 represent the system bus architecture of computer system 101. However, these arrows are illustrative of any interconnection scheme serving to link the subsystems. For example, speaker 220 could be connected to the other subsystems through a port or have an internal connection to central processor 202. Computer system 101 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, C#, Pascal, Fortran, Perl, Matlab (from MathWorks, Inc.), SAS, SPSS, Java, JavaScript, and AJAX. The computer software product may be an independent application with data input and data display modules. Alternatively, the computer software products may be classes that may be instantiated as distributed objects. The computer software products may also be component software such as Java Beans (from Oracle) or Enterprise Java Beans (EJB from Oracle).

An operating system for the system may be one of the Microsoft Windows® family of operating systems (e.g., Windows 95, 98, Me, Windows NT, Windows 2000, Windows XP, Windows XP x64 Edition, Windows Vista, Windows 7, Windows CE, Windows Mobile), Linux, HP-UX, UNIX, Sun OS, Solaris, Mac OS X, Alpha OS, AIX, IRIX32, or IRIX64, or combinations of these. Microsoft Windows is a trademark of Microsoft Corporation. Other operating systems may be used. A computer in a distributed computing environment may use a different operating system from other computers.

Furthermore, the computer may be connected to a network and may interface to other computers using this network. For example, each computer in the network may perform part of the task of the many series of steps of the invention in parallel. Furthermore, the network may be an intranet, internet, or the Internet, among others. The network may be a wired network (e.g., using copper), telephone network, packet network, an optical network (e.g., using optical fiber), or a wireless network, or any combination of these. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

Figure 3:
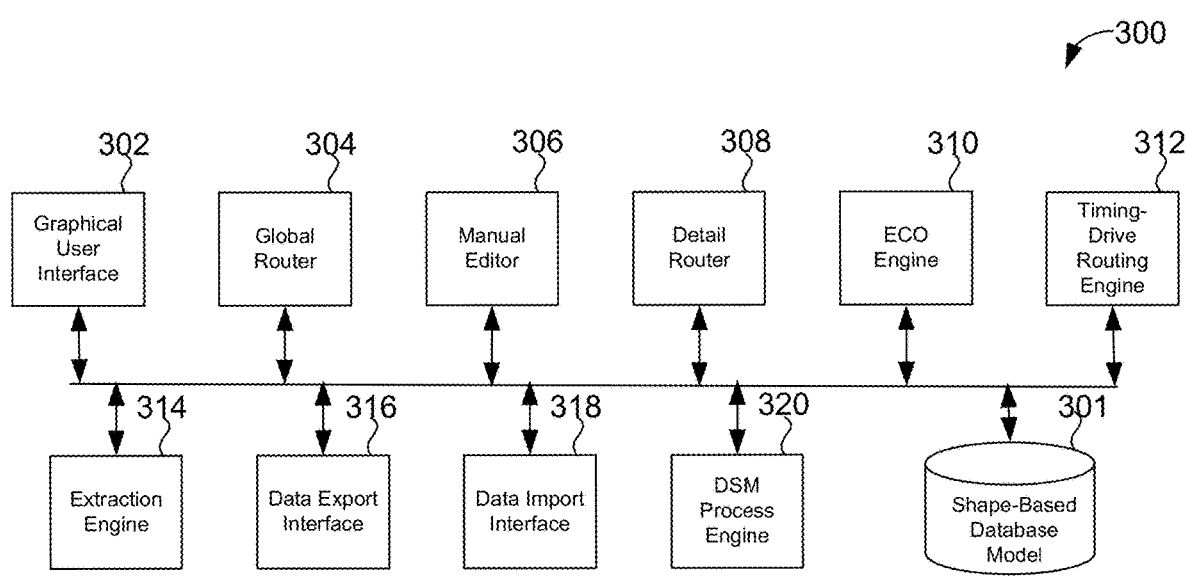
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. The EDA system provides such tools as a graphical user interface 302, global router 304, manual editor 306, detail router 308, engineering change option (ECO) engine 310, timing-driven routing engine 312, extraction engine 314, data export interface 318, and DSM process engine 320. An EDA system may include any number of the system tools shown in FIG. 3, and in any combination. Further, the EDA system may include additional tools not shown in FIG. 3.

An EDA system may be a grid-based system or shape-based system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood" operation.

The shape may be representative of any polygon. For example, the shape may be a rectangle. The shape may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used such as 30 degrees, 35 degrees, 36 degrees, 42 degrees, 45 degrees, or 60 degrees) turns as needed to route around the obstacle.

Chip design, be it analog, custom or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design.

The grid-based approach offers fast routing but requires customization to handle off-grid connections and is inefficient for post-route timing and signal integrity optimizations. When net widths and spacings must be changed to reduce resistance or cross-talk, grid-based approaches waste space by moving nets to the next available grid and waste time by resorting to rip-up and re-route techniques. Gridded systems are not good at irregular intervals, irregular spacings, or routing things that do not fit onto a regular grid.

The gridless approach easily handles off-grid connections and is efficient for post-route optimizations. In a shape-based or gridless system, the layout may be a gridless layout, which means there is no grid which structures or polygon of the layout are associated with, other than a grid for the relevant manufacturing process, if any.

In an embodiment, the structure of database 301 facilitates shape-based operations. For example, a structure of this database may include an obstacle tree having nodes and leaves containing the obstacles of an integrated circuit. This tree structure permits rapid determination of where obstacles are when doing operations on the database, such as routing nets.

In FIG. 3, the EDA system 300 includes one or more of the components discussed below, in any combination. One skilled in the art will recognize that one or more of components shown in FIG. 3 may not be required to practice specific aspects of present invention. For example, when DSM process engine 320 is omitted from system, the system could still perform automatic routing of interconnect, but without providing DRC checking capabilities.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that coarsely routes interconnects of the integrated circuit, thus enabling large designs to be routed more rapidly and completely. The global router may also provide visual and quantitative analysis of the congestion in the design by highlighting problem areas that can be fixed by incremental adjustments to the floor plan. The global router is sometimes referred to as a coarse router because it provides generally the routes for the interconnect, and may work in conjunction with a detail router 308 (discussed below) to place the geometries of the interconnect.

A manual editor 306 is a shape-editing suite for creating or editing metal, keep-outs, routing areas, and the ability to partition a design into smaller areas. These areas can then be worked upon individually and can be recombined at a later stage to complete the design. Full on-line design rule checking (DRC) ensures that manual operations are completed error-free first time. Powerful tools automatically push-aside existing wiring to make way for new wires and semiautomatic routing tools quickly close down troublesome nets by allowing the user to guide the routing engine around complex areas of the design.

The detail router 308 is an automatic router that completes the wiring in a design by determining the specific routes for each interconnect. The detail router may complete a portion of the wiring for design, such as for sections or specified cells of the design, or may complete all the wiring of the design. The detail router may route starting from scratch or from partially completed routing. In an implementation, the global router determines the general route paths for the interconnect, and the detail router takes this routing information from the global router and puts in the physical detailed geometries of the tracks and vias.

An engineering change order (ECO) engine 310 provides a capability to handle late stage ECO changes. Every element of the design can be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them minimizing the disruption to the design. When pushing or pulling cells, the wires remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides RC timing analysis of interconnects. Used in concert with the detail router, the timing engine can determine the path of least delay for critical nets. Furthermore, the timing engine, in concert with an extraction engine, can actively select a longer path with a lower associated delay (e.g., due to lower capacitance) in preference to a shorter but slower route.

An extraction engine 314 is provided. Utilizing a unified, high-speed RC extraction engine, the crosstalk functionality accurately calculates the coupling between victim and aggressor signals. This same technology is then used to identify potential problems, and automatically implements a DRC correct solution without changing the path of the signal unnecessarily. In addition, signal-to-signal (or within and between classes of signals) spacing rules can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction info from the RC engine in order determine whether an interconnect route meets current density rules, and widen the interconnect width as needed. More details are discussed in U.S. patent application Ser. Nos. 10/709,843 and 10/709,844, both filed Jun. 1, 2004 and incorporated by reference.

In a specific embodiment, an RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis.

The tightly coupled, high-speed RC extraction engine is used both during routing (global router or detail router, or both) and for post-routing extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool to which it is being exported.

A data import interface 318 provides the means to import data, such as a circuit layout, netlist, or design constraints. The data to be import may be in various formats including data saved from other EDA systems or software tools. In addition, the source of the data may be a database, floppy drive, tape, hard disk drive, CD-ROM, CD-R, CD-RW, DVD, or a device over a communication network. Some examples of import formats include text, ASCII, GDSII, Verilog, SIF, and LEF/DEF.

A DSM process engine 320 is provided. The DSM process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A user may design an integrated circuit using a system such as shown in FIG. 3. A representative flow for designing an integrated circuit is outlined in steps 1 to 8 below. Step 5 is further subdivided into three substeps.

Integrated Circuit Design Flow
1. Provide Circuit Specification
2. Create Circuit Design
3. Generate Netlist
4. Simulate Performance and Verify Functionality of Circuit Design
5. Generate Layout
   5a. Layout Devices
   5b. Connect Devices
   5c. Connect Blocks of Circuitry
6. Physical Verification and Design Checking
7. Create Masks
8. Fabricate Integrated Circuit Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitics and RC considerations from the layout can be back-annotated into the netlist or circuit design, and the design simulated again. The results of this simulation will presumably be more accurate because more precise information is provided.

Figure 10:
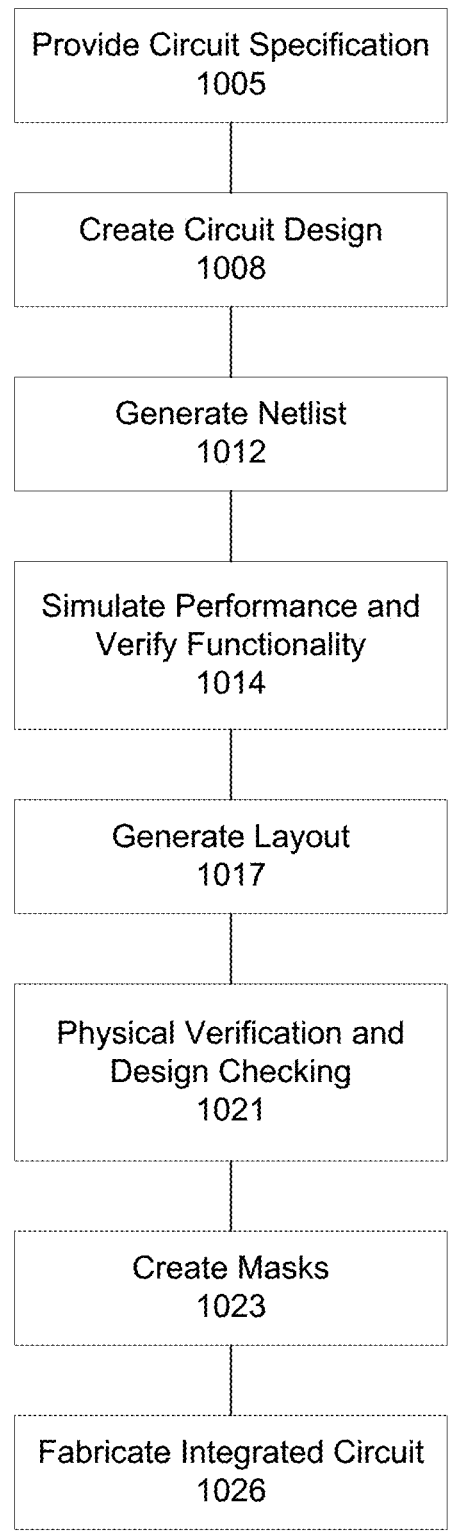
FIG. 10 shows an integrated circuit design flow.

Referring to FIG. 10, in step 1 (1005) of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2 (1008), an engineer creates a circuit design that presumably will meet the circuit specification. This circuit design may include transistors, resistors, capacitors, and other electronic components. The engineer uses these electronic components as building blocks of the design, interconnecting them to achieve the desired functionality and performance. The engineer may make a custom design using electronic component building blocks or use a gate array, where the building blocks are sets of cells set by the gate array manufacturer. The design may be input using a graphical design tool such as schematic capture program, and any other design tool may be used. The circuit may be described using a high-level design language (HDL). These design tools will create a netlist (step 3 (1012)) of the circuitry, which is a listing of the components of the devices and their interconnections.

During the design phase, the engineer simulates the performance and verifies the functionality of the circuitry (step 4 (1014)). There are transistor and process models to model the components. Some simulation tools include Spice, which performs circuit simulation, and Verilog, which performs functional and timing verification. This is where the electrical information for current density routing is generated.

After deciding upon an initial circuit design, the engineer begins layout (step 5 (1017)) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layers. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5b).

In step 6 (1021), after or while the layout is generated, the physical design is verified and checked. For example, some of these operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII or other format) that is used to make the masks (step 7 (1023)). The masks are used to fabricate the integrated circuit (step 8 (1026)) using a photolithography process. Typically, there are many "copies" of the same integrated circuited fabricated on the same wafer. Each integrated circuit is a "die" on the wafer. Good dies are separated from the bad dies. The good dies are sawed and packaged. Packaging generally includes encapsulating the die in plastic or other material, and connecting pads of the integrated circuit to pins of the package, where the integrated circuit can be interfaced.

A basic flow of simultaneous place and route for analog designs is as follows. A specific flow example is presented below, but it should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data.

1. Generate a random normalized polish expression.
2. Generate the associated placement and routing, along with its "cost." That is, how good a potential placement/routing solution the polish expression gives.

This step lists a place and route the design described by the polish expression from the bottom up. That is, we write the normalized polish expression as a skewed slicing tree and begin by placing and routing each pair of leaves in the tree.

Placement will be as per the simulated annealing floorplanning methods, in that each cell may be placed in either of the rectilinear rotations and the cells are placed either one above the other (when the polish expression specifies a horizontal split) or side by side (when the polish expression specifies a vertical split). This gives several options, which must now be routed using a combination of traditional routing techniques and detection of specific patterns. At this stage we can calculate an intermediate cost for the candidate solutions, and prune unpromising branches. The cost function will be based on the wire length and whitespace. Note that there may be multiple equally good routings which we must retain at this stage.

We can now continue up the tree, combining child solutions in a similar manner. This ultimately results in a fully placed and routed candidate solution, with a corresponding cost.

3. Perform simulated annealing on the normalized polish expression with the standard perturbations (as per the well-known simulated annealing approach to floor planning). Each polish expression encountered during the process is placed and routed as in the previous step, which also provides the cost function.

Figure 4A:
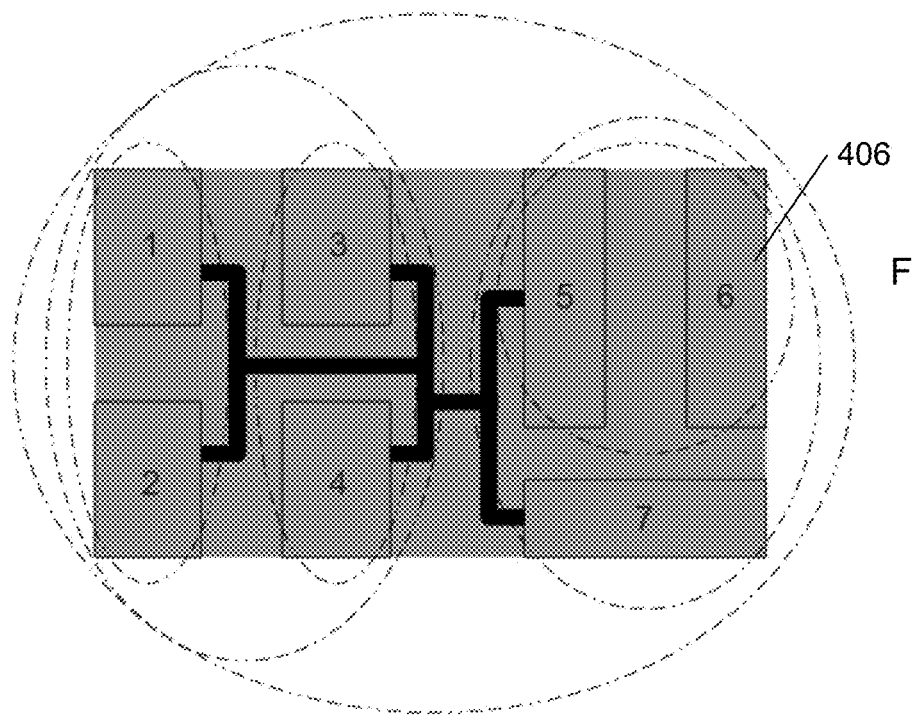
FIGS. 4A-4B show an example of a simultaneous place and route.
Figure 4B:
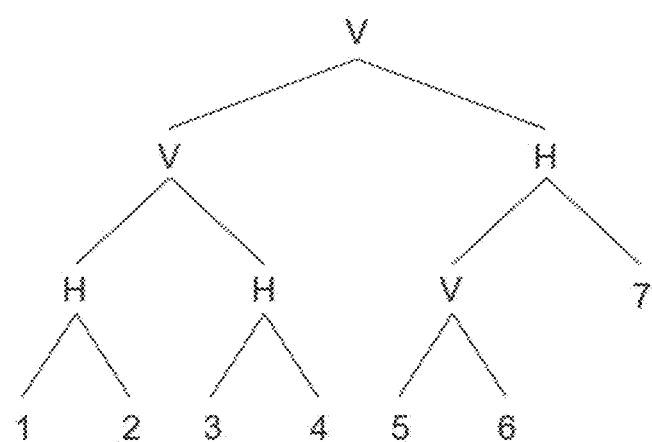

FIGS. 4A and 4B show an example of a simultaneous place and route. An example of a placed and routed layout for the normalized polish expression 12H34HV56V7HV. The skewed slicing tree equivalent to this expression is shown, with the circled areas of the layout diagram corresponding to the branches of the tree.

We place and route this example (as well as calculating its cost for simulated annealing) beginning at the bottom of the tree. So, we start by placing and routing cells 1 and 2, cells 3 and 4, and cells 5 and 6. Cells 1 and 2 are split horizontally so they are placed one above the other, as are cells 3 and 4. Cells 5 and 6 are split vertically, so they are placed side by side.

This process is likely to result in more than one possible layout in each case.

We proceed up the tree, combining all combinations of the candidate solutions we've obtained. That is, we combine all the possibilities for the placement and routing of 1 and 2 with all those for 3 and 4, and we combine all those for 5 and 6 with 7.

At each stage we calculate the intermediate cost (in terms of wire length and whitespace) of each sub-layout, and we may prune any unpromising candidates.

Finally we combine both sides of the tree to create a fully placed and routed solution of lowest cost.

Figure 5A:
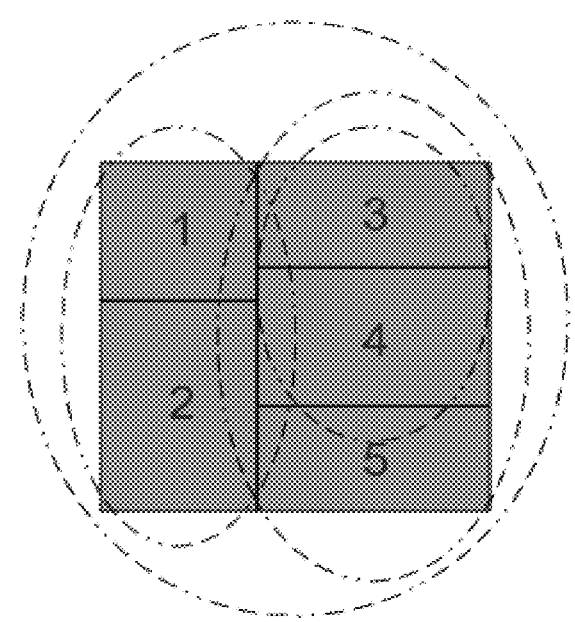
FIGS. 5A-5B show an example of a simultaneous place and route.
Figure 5B:
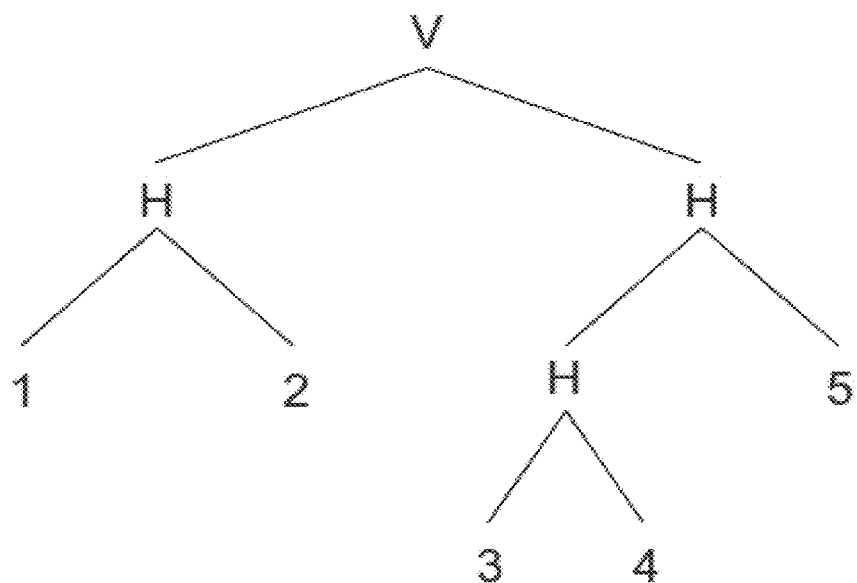

FIGS. 5A-5B show an example of a simultaneous place and route. An example of a layout for the normalized polish expression 12H34H5HV. Again, the corresponding skewed slicing tree is shown along with the resulting layout diagram, where the branches of the tree are circled.

Here we begin by placing cells 1 and 2, and cells 3 and 4, both with a horizontal split (i.e., one above the other). We then find the routings of lowest possible cost. Next we place and route cell 5 with the results of combining 3 and 4. As in the previous example, this process will lead to multiple admissible solutions.

Finally we construct a fully placed and routed layout by combining the two halves of the tree that we have already calculated. At this point we take the single lowest cost layout from all the possibilities.

Figure 6A:
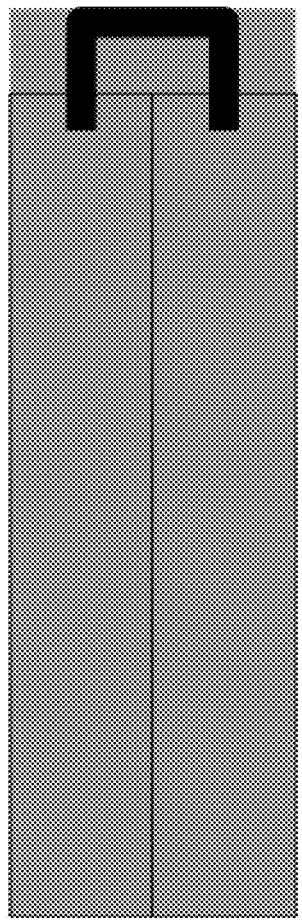
FIGS. 6A-6B show an example of a simultaneous place and route.
Figure 6B:
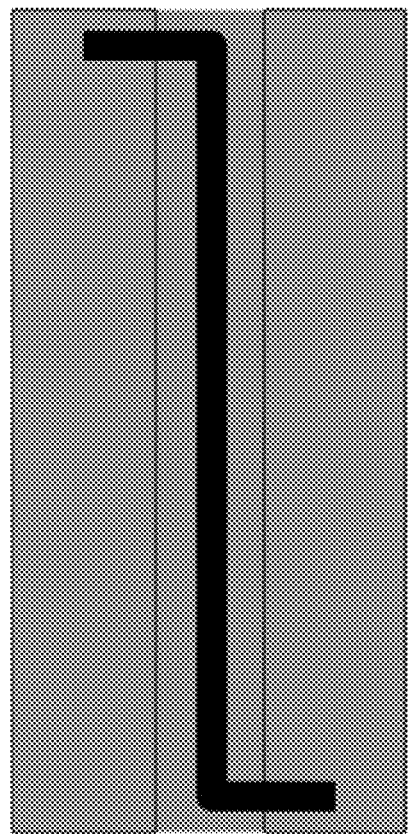

FIGS. 6A-6B show an example of a simultaneous place and route. Here is an example of two possible placements/routings for two cells combined with a vertical split. In this case, the solution on the left (FIG. 6A) has the lowest cost.

FIGS. 7A-7C show an example of a simultaneous place and route. Here are three possible placements/routings for two cells combined with a horizontal split. The leftmost layout (FIG. 7A) has the lowest cost.

FIGS. 8A-8B show an example of a simultaneous place and route. Here we combine two copies of the result of example in FIGS. 6A-6B, with either a vertical or horizontal split.

FIGS. 9A-9D show an example of a simultaneous place and route. We will often look for predetermined patterns that we can route in a manner optimized for analog designs. These figures show an example of some patterns.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
generating a first expression;
using at least one computer processor, using the first expression, generating a first place-and-route solution for an integrated circuit design, wherein the integrated circuit design comprises a plurality of cells, and the first place-and-route solution can comprise an interconnect routing path formed on different interconnect layers;
generating a second expression;
using the second expression, generating a second place-and-route solution for the integrated circuit design;
generating a third expression;
using the third expression, generating a third place-and-route solution for the integrated circuit design, wherein each of the first, second and third place-and-route solutions are different from each other;
calculating a first cost function for the first place-and-route solution;
calculating a second cost function for the second place-and-route solution;
calculating a third cost function for the third place-and-route solution;
comparing the first, second, and third cost functions based on wire length and whitespace parameters;
based on the comparison first, second, and third cost functions, selecting one of the first, second, and third place-and-route solutions to obtain a selected place-and-route solution, and discarding the place-and-route solutions not selected; and
placing each cell of the selected place-and-route solution adjacent to each other in a direction based on the expression associated with the selected place-and-route solution.

2. The method of claim 1 comprising:
forming a photolithography mask comprising at least a portion of the selected place-and-route solution.

3. The method of claim 1 comprising:
forming an integrated circuit comprising at least a portion of the selected place-and-route solution.

4. The method of claim 1 wherein the first expression comprises a random normalized polish expression.

5. The method of claim 1 wherein the first, second, and third expressions comprise a random normalized polish expressions.

6. The method of claim 1 wherein for the first place-and-route solution for a horizontal split, a first cell has a first edge and the second cell has a second edge, and a first interconnect extends directly from the first edge to the second edge without a 90-degree turn, and the first edge is parallel to the second edge.

7. The method of claim 6 wherein for the second place-and-route solution for a horizontal split, a second interconnect extends from the first edge to the second edge having at least one 90-degree turn, and the first edge is transverse to the second edge.

8. The method of claim 7 wherein for the third place-and-route solution for a horizontal split, a third interconnect extends from the first edge to the second edge having at least two 90-degree turns, and the first and second edges are transverse to the horizontal split.

9. The method of claim 1 wherein for the first place-and-route solution for a horizontal split, a first cell has a first edge and the second cell has a second edge, the first and second edges are separated by a space and parallel to each other, and a first interconnect extends between the first edge to the second edge without a 90-degree turn;
for the second place-and-route solution for a horizontal split, the first edge is oriented transverse to the second edge, and a second interconnect extends from the first edge to the second edge having at least one 90-degree turn; and
for the third place-and-route solution for a horizontal split, the first edge is parallel to the second edge, and a third interconnect extends from the first edge to the second edge having at least two 90-degree turns.

10. The method of claim 1 wherein for the first place-and-route placement, a vertical split comprises a first interconnect routing path comprising a first cell and a second cell with a space between the cells,
the first cell comprises first, second, third and fourth edges, the first edge is opposite of the third edge, the second edge is opposite of the fourth edge,
the second cell comprises fifth, sixth, seventh, and eighth edges, the fifth edge is opposite to the seventh edge, the sixth edge is opposite of the eighth edge,
the space is between the second and eighth edges and bounded by a first line passing through the first and fifth edges, and a second line passing through third and seventh edges, and
a second interconnect is routed from the second edge to the eighth edge, at least a portion of the second interconnect is in the space and extends parallel to the second and eighth edges, and a portion of the second interconnect is in the space and extends transverse to the second and eighth edges.

11. The method of claim 10 wherein for the second place-and-route placement, a vertical split comprises a second interconnect routing path comprising a third cell and a fourth cell that are placed adjacent to each other,
the third cell comprises first, second, third and fourth edges, the first edge is opposite to the third edge, the second edge is opposite of the fourth edge,
the fourth cell comprises fifth, sixth, seventh, and eighth edges, the fifth edge is opposite to the seventh edge, the sixth edge is opposite of the eighth edge,
the second edge touches the eighth edge, and
a third interconnect is routed from the first edge to the fifth edge, wherein at least a portion of the third interconnect extends parallel to the first and fifth edges, and a portion of the third interconnect extends transverse to the first and fifth edges.

12. A method comprising:
generating a first expression;
using at least one computer processor, using the first expression, generating a first place-and-route solution for an integrated circuit design, wherein the integrated circuit design comprises a plurality of cells, and the first place-and-route solution can comprise an interconnect routing path formed on different interconnect layers;

generating a second expression;
using the second expression, generating a second place-and-route solution for the integrated circuit design;
generating a third expression;
using the third expression, generating a third place-and-route solution for the integrated circuit design, wherein each of the first, second and third place-and-route solutions are different from each other;
calculating a first cost function for the first place-and-route solution;
calculating a second cost function for the second place-and-route solution;
calculating a third cost function for the third place-and-route solution;
comparing the first, second, and third cost functions based on wire length and whitespace parameters;
based on the comparison of the first, second, and third cost functions, selecting one of the first, second, and third place-and-route solutions to obtain a selected place-and-route solution; and
placing each cell of the selected place-and-route solution adjacent to each other in a direction based on the expression associated with the selected place-and-route solution,
wherein for the first place-and-route solution, a first cell has a first edge and the second cell has a second edge, the first and second edges are parallel to each other and a first interconnect extends between the first edge to the second edge without a 90-degree turn;
for the second place-and-route solution, the first edge is oriented transverse to the second edge, and a second interconnect extends from the first edge to the second edge having at least one 90-degree turn; and
for the third place-and-route solution, the first edge is parallel to the second edge, and a third interconnect extends from the first edge to the second edge having at least two 90-degree turns.

13. The method of claim 12 comprising:
forming a photolithography mask comprising at least a portion of the selected place-and-route solution.

14. The method of claim 12 comprising:
forming an integrated circuit comprising at least a portion of the selected place-and-route solution.

15. The method of claim 12 wherein the first expression comprises a random normalized polish expression.

16. The method of claim 12 wherein the first, second, and third expressions comprise a random normalized polish expressions.

17. A system comprising:
an expression generator, wherein the expression generator generates a first expression, second expression, and third expression,
a place-and-route solution generator, wherein the place-and-route solution generator uses the first expression as input and outputs a first place-and-route solution for an integrated circuit design, wherein the integrated circuit design comprises a plurality of cells, and, and the first place-and-route solution can comprise an interconnect routing path formed on different interconnect layers,
the place-and-route solution generator uses the second expression as input and outputs a second place-and-route solution for the integrated circuit design,
the place-and-route solution generator uses the third expression as input and outputs a third place-and-route solution for the integrated circuit design, and
each of the first, second and third place-and-route solutions are different from each other;
a cost function calculator, wherein the cost function calculator determines a first cost function for the first place-and-route solution, a second cost function for the second place-and-route solution, and a third cost function for the third place-and-route solution;
a selection interface, wherein selection interface allows based on the first, second, and third cost functions, selecting one of the first, second, and third place-and-route solutions to obtain a selected place-and-route solution based on a comparison of wire length and whitespace parameters for each of the first, second, and third place-and-route solutions, and discarding the place-and-route solutions not selected; and
a cell placement component, wherein the cell placement component places each cell of the selected place-and-route solution adjacent to each other in a direction based on the expression associated with the selected place-and-route solution.

18. The system of claim 17 comprising:
a photolithography mask, comprising at least a portion of the selected place-and-route solution.

19. The method of claim 17 comprising:
an integrated circuit, comprising at least a portion of the selected place-and-route solution.

20. The method of claim 17 wherein the first, second, and third expressions comprise a random normalized polish expressions.

* * * * *